United States Patent
Fuerst et al.

(10) Patent No.: US 11,537,767 B2
(45) Date of Patent: Dec. 27, 2022

(54) AUTOMATED CONTROL THROUGH A TRAFFIC MODEL

(71) Applicant: NEC Laboratories Europe GmbH, Heidelberg (DE)

(72) Inventors: Jonathan Fuerst, Heidelberg (DE); Flavio Cirillo, Heidelberg (DE); Mauricio Fadel Argerich, Heidelberg (DE)

(73) Assignee: NEC CORPORATION, Tokyo (JP)

( * ) Notice: Subject to any disclaimer, the term of this patent is extended or adjusted under 35 U.S.C. 154(b) by 479 days.

(21) Appl. No.: 16/699,161

(22) Filed: Nov. 29, 2019

(65) Prior Publication Data

US 2021/0165931 A1 Jun. 3, 2021

(51) Int. Cl.
| G06F 30/20 | (2020.01) |
| G06F 16/906 | (2019.01) |
| G06Q 50/26 | (2012.01) |
| G08G 1/127 | (2006.01) |
| G08G 1/01 | (2006.01) |

(52) U.S. Cl.
CPC .......... *G06F 30/20* (2020.01); *G06F 16/906* (2019.01); *G06Q 50/26* (2013.01); *G08G 1/0116* (2013.01); *G08G 1/0129* (2013.01); *G08G 1/0145* (2013.01); *G08G 1/127* (2013.01)

(58) Field of Classification Search
CPC ....... G06F 30/20; G06F 16/906; G06Q 50/26; G08G 1/0116; G08G 1/0129; G08G 1/0145; G08G 1/127; G08G 1/0112
See application file for complete search history.

(56) References Cited

U.S. PATENT DOCUMENTS

| 9,953,113 B2 | 4/2018 | Yang et al. |
| 2014/0324395 A1 | 10/2014 | Silverman et al. |

FOREIGN PATENT DOCUMENTS

| CN | 101710449 A | 5/2010 |
| CN | 107749165 A | 3/2018 |
| EP | 2590151 A1 | 5/2013 |

(Continued)

OTHER PUBLICATIONS

Zambrano-Martinez JL, Calafate CT, Soler D, Cano J-C, Manzoni P. Modeling and Characterization of Traffic Flows in Urban Environments. Sensors. 2018; 18(7):2020. https://doi.org/10.3390/s18072020.*

(Continued)

*Primary Examiner* — Brian P Sweeney
(74) *Attorney, Agent, or Firm* — Leydig, Voit & Mayer, Ltd.

(57) ABSTRACT

A method for traffic control includes ingesting public transport data with one or more extract-transform-load procedures. A route of a public transport vehicle is reconstructed based on the ingested public transport data. The reconstructed vehicle route is partitioned into discrete route segments, each of the discrete route segments being defined by parameters spanning multiple dimensions. The discrete route segments are clustered into multiple groups based on the respective multidimensional parameters of each of the discrete route segments. The route segments are scored based on the clustering to create a traffic model which is useable to implement traffic control measures or to change mobility infrastructure.

16 Claims, 11 Drawing Sheets

(56) References Cited

FOREIGN PATENT DOCUMENTS

WO 2018023331 A1 2/2018

OTHER PUBLICATIONS

Chmiel, W., Dańda, J., Dziech, A. et al. INSIGMA: an intelligent transportation system for urban mobility enhancement. Multimed Tools Appl 75, 10529-10560 (2016). https://doi.org/10.1007/s11042-016-3367-5.*

Loewenherz, Franz "Video Analytics towards Vision Zero," ITE/IMSA Annual Joint Meeting, Feb. 13, 2017.

Fay, Damien, et al. "Knowledge Discovery and Causality in Urban City Traffic: a study using Planet Scale Vehicular Imagery Data," Proceedings of the Sixth ACM SIGSPATIAL International Workshop on Computational Transportation Science, Nov. 5-8, 2013.

Thakur, Gautam S. et al. "Spatial and Temporal Analysis of Planet Scale Vehicular Imagery Data," 2011 11th IEEE International Conference on Data Mining Workshops, Sep. 14-16, 2011.

Cookson, Graham et al. "INRIX Global Traffic Scorecard-Appendices," INRIX Research, Feb. 2017.

Kozievitch, Nadia P. et al. "Exploratory Analysis of Public Transportation Data in Curitiba," Jul. 2016.

Dixon, Simon et al. "The 2019 Deloitte City Mobility Index," Deloitte Insights, Jan. 7, 2019.

Ali, Muhammad Intizar et al. "CityBench: a Configurable Benchmark to Evaluate RSP Engines Using Smart City Datasets," Oct. 24, 2015.

Syrjärinne, Paula, "Urban Traffic Analysis with Bus Location Data," Academic Dissertation, University of Tampere, Mar. 11, 2016.

Honarvar, Ali Reza et al. "Multi-source dataset for urban computing in a Smart City," Elsevier Inc., Oct. 3, 2018.

"Bliksem Integration: the introduction," Plannerstack, Mar. 18, 2014.

* cited by examiner

AUTOMATED CONTROL THROUGH A TRAFFIC MODEL

FIELD

The present invention relates to methods and systems for producing and/or applying traffic models which are supported by artificial intelligence (AI) and are useable for traffic control.

BACKGROUND

Traffic management (or more general mobility management) is a core function of modern city operation. People need to commute to work, go for grocery shopping or participate in city traffic in order to take part in leisure activities (cinema, concerts etc.). As such, it is crucial for city operators to make commutes as comfortable as possible. A relevant parameter for many traffic participants is time spent on their trip. In addition, reducing traffic congestion leads to less air pollution. Therefore, to improve commutes and citizens' quality of life, cities are interested in improving the flow of traffic on their road networks by, for example, removing bottlenecks that can cause congestion and as consequence increased air pollution and passenger discomfort. FIG. 1 shows urban transportation policy making (e.g. optimizing bus schedules, scheduling traffic lights, etc.) by policy makers 102 based on city mobility insights 100.

To measure a current mobility situation (e.g., to generate city mobility insights), city operators (e.g., policy makers) can rely on surveys, traffic counting, simulations, and sensors embedded in city infrastructure (e.g., magnetic loop sensors). As shown in FIG. 2, larger cities might also employ consulting and data aggregating/analytics firms which may provide a database 200 which includes proprietary and privacy-sensitive data. Artificial intelligence and business intelligence 205 can be used to process the data in database 200.

Infrastructure Sensors: Some cities have magnetic loop sensors installed, which count how many vehicles pass. Cities might have further access to camera data and other infrastructure sensors to count vehicles. Some companies are using cameras and video analytics to analyze traffic at road intersections. See, for example, Franz Loewenherz. "Video Analytics towards Vision Zero", ITE/IMSA Annual Joint Meeting (Feb. 13, 2017), which is hereby incorporated by reference herein. Previous work has used public web/traffic cameras to infer traffic density. See, for example: Fay, Damien, et al. "Knowledge Discovery and Causality in Urban City Traffic: A study using Planet Scale Vehicular Imagery Data", Proceedings of the Sixth ACM SIGSPATIAL International Workshop on Computational Transportation Science, A C M, 2013 (hereby incorporated by reference herein); Thakur, Gautam S., et al. "Spatial and temporal analysis of planet scale vehicular imagery data." 2011 IEEE 11th International Conference on Data Mining Workshops. IEEE, 2011 (hereby incorporated by reference herein).

Traffic Surveys/Traffic Counting: Cities can perform commuter surveys to understand traffic patterns and rely on traffic counting to understand the traffic density and distribution of road segments.

Big Data Analytics: Companies collect anonymized traffic data on congestion and incidents from connected vehicles, mobile devices and roadway sensors and cameras, aggregate them and provide actionable insights to single vehicles and to local governments. See, for example, Cookson, Graham, and Pishue, "INRIX Global Traffic Scorecard—Appendices", INRIX research (2017), which is hereby incorporated by reference herein.

The above-described existing solutions require substantial effort to collect the necessary data and derive actionable insights for city operators. For example, the installation of traffic sensors is costly, while traffic surveys and counting require human effort and only result in a one-time status measurement. In addition, new privacy-awareness of citizens and related regulations (e.g. GDPR) might become a hurdle to overcome for such analytics. Accordingly, it may be difficult to provide a database 300 of open data (see FIG. 3) from which city mobility insights 100 can be effectively and/or accurately derived.

SUMMARY

In an embodiment, the present invention provides a method for traffic control. The method includes ingesting public transport data with one or more extract-transform-load procedures. A route of a public transport vehicle is reconstructed based on the ingested public transport data. The reconstructed vehicle route is partitioned into discrete route segments, each of the discrete route segments being defined by parameters spanning multiple dimensions. The discrete route segments are clustered into multiple groups based on the respective multidimensional parameters of each of the discrete route segments. The route segments are scored based on the clustering to create a traffic model which is useable to implement traffic control measures or to change mobility infrastructure.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 8 can include leveraging another city's benchmark model.

DETAILED DESCRIPTION

Figure 1:
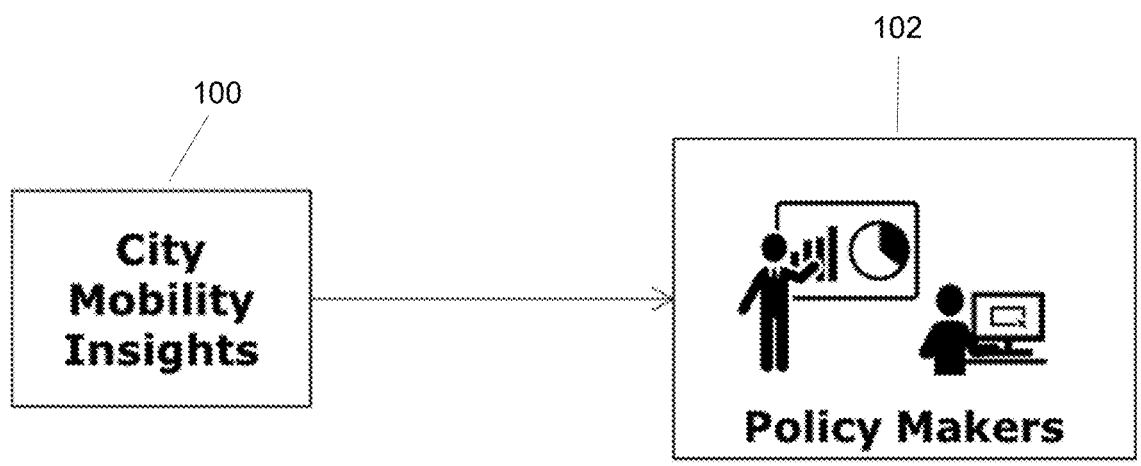
FIG. 1 illustrates a smart mobility approach where policies are based on city mobility insights.
Figure 2:
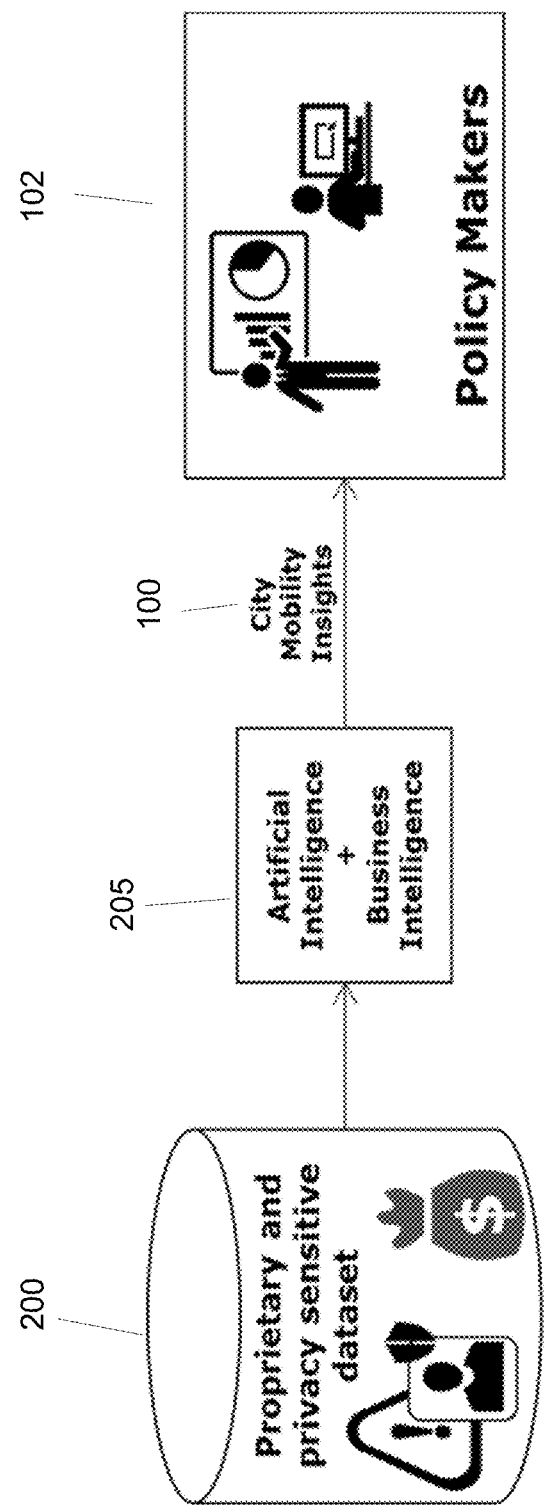
FIG. 2 illustrates that existing approaches to smart mobility rely on privacy sensitive and/or proprietary data.

In an embodiment, the present invention provides a processing system configured to produce a city mobility benchmark model. The city mobility benchmark model can achieved through (e.g., the processing system can be configured to perform): (1) automated data integration from available open data sources such as public transport bus schedules, actual registered bus arrival times and available sensor data, and data extracted from a global geographic information system and/or (2) the computation of temporal scores for single road segments and of a composite city mobility model. The output of the benchmark model can be used for policy making (e.g., for traffic management, traffic optimization) to identify and improve existing bottlenecks and pain-points or congestion areas, and for enabling automated systems (e.g., automated driving, smart city operation).

The processing system can be configured to automatically apply the output of the benchmark model to control automated systems. For example, the processing system can be configured to automatically apply the output to adjust one or more traffic light timings (e.g., time intervals and/or sequences) and/or route (e.g., autonomously control) one or more autonomous vehicles.

The processing system according to embodiments of the present invention include applications effecting improvements such as:

a. City mobility insights for autonomous driving: Autonomous vehicles require knowledge of traffic flow in form of a traffic model in a city as it is the input for path planning and decision making. The processing system can be configured to automatically route autonomous vehicles based on the benchmark model. For example, the processing system can deliver a route to an autonomous vehicle, which the autonomous vehicle then follows.

b. City mobility insights for policy making: Policy makers can rely on the output knowledge for decision making. E.g., to propose road construction, parking zone designations, and revise speed limits.

c. City mobility insights for marketing: generation of city insights (e.g., model outputs) for marketing purposes: "How many people on a certain street at night?"; "Is it a safe area?"; "it is good for a new shop?".

d. City mobility insights for actuating automating smart city infrastructure. The insights (e.g., the output of the benchmark model) can be the input for automated city operation processes. For example, the processing system can be configured to use the insights to automatically adjust traffic light operation dynamically according to a traffic model generated the processing system in order to optimize predetermined targets (e.g., increase the flow on some streets, decrease the flow on other streets to protect people from noise and air pollution).

In contrast with existing approaches, the processing system can be configured to solely rely on, as external inputs, existing, basic data sources (bus schedules) that are widely available in cities around the world and public to infer the traffic situation of segment roads, and by combining these, of a city. These inputs can be collected with less effort (e.g., using fewer computational resources) than those inputs required by existing approaches such as infrastructure sensing, crowd-sourced data collection from mobile devices and connected vehicles or manual traffic counting and surveys.

Compared to existing systems that use highly available and dense data-sources (e.g., as achieved through directly accessing mobility data from end-user devices), embodiments of the processing system offer a reduced granularity depending on the density of the bus stops and the frequency of bus trips. This means that there will normally be less data which needs to be processed, thereby resulting in faster predictions and computation and/or savings of computational resources by reduced consumption of computational processing power and memory. Throughout the specification, a bus is used as an example of a vehicle that can be autonomous and/or for public transportation. Therefore, embodiments which refer to a bus are equally applicable to embodiments with other types of public transport device and/or vehicles including autonomous vehicle. The processing system can be configured to automatically perform traffic analysis for cities and, based on such analysis, automatically adjust infrastructure (e.g., traffic light timings, control one or more autonomous vehicles through route adjustments).

While the above-described existing approaches to accumulating traffic measurements generally rely on new equipment, the processing system can be configured to rely on automated integration of existing data sources such as one or more of (e.g., all of): public transport bus schedules, actual observed bus arrival times, and context data extracted from a global geographic information system (GIS). The processing system can be configured to then feed this data into a mobility model that computes a traffic index on the granularity of single road segments. These traffic indices can then be aggregated to a composite mobility benchmark model for the city.

In an embodiment, the processing system advantageously utilizes bus schedules as a strong indicator for the congestion of road segments when calibrated with GIS metadata (for example the length of segments, number of lanes, speed limit, traffic lights, number of turns, intersections etc.) and put in relation to other cities. A key feature of an embodiment of the invention (e.g., an embodiment of the processing system) is that it is able to quickly integrate data sources across different cities with little human (e.g., zero manual) intervention. Thereby, scores of cities and single road segments can be compared with other cities and road segments' scores, providing a relative comparison on different granularities faster and/or utilizing less computational resources to do so. For example, the processing system can be configured to enable city operators to quickly and continuously gain an understanding of the state and ranking of their city infrastructure.

In an embodiment, a method for traffic control includes ingesting public transport data with one or more extract-transform-load procedures. A route of a public transport vehicle is reconstructed based on the ingested public transport data. The reconstructed vehicle route is partitioned into discrete route segments, each of the discrete route segments being defined by parameters spanning multiple dimensions. The discrete route segments are clustered into multiple groups based on the respective multidimensional parameters of each of the discrete route segments. The route segments are scored based on the clustering to create a traffic model which is useable to implement traffic control measures or to change mobility infrastructure.

In an embodiment, the model is useable as an input to at least one of an autonomous driving system and an automated smart infrastructure system.

In an embodiment, the ingested public transport data comprises open transport data, geographical information system (GIS) data and global-positioning-system (GPS) data.

In an embodiment, the traffic model is a first traffic model and the method further comprises scoring the respective route segments by clustering the respective route segments with pre-scored route segments of a preexisting second traffic model. The second traffic model is preferably from a different geographical location than the first traffic model, wherein the clustering determines similarities among the respective route segments of the different geographical locations.

In an embodiment, ingesting the public transport data comprises structuring the public transport data into a sequence of stops. For example, the route of the public transport vehicle is reconstructed by projecting a respective path of the public transport vehicle between multiple pairs of consecutive stops of the sequence of stops.

In an embodiment, the public transport data includes bus lines, bus stop locations, and bus schedules, wherein the route of the public transport vehicle is a bus route, and wherein the stops are bus stops.

In an embodiment, the traffic model serves as an input to an autonomous driving system such that the vehicle or another vehicle is autonomously routed based on the traffic model.

In an embodiment, the traffic model serves as an input to an automated smart infrastructure system such that the smart infrastructure system autonomously controls traffic light timings based on the traffic model.

In an embodiment, the multi-dimensional parameters comprise one or more of a number of traffic lights, a number of turns, a number of lanes, and a speed limit.

In an embodiment, the multi-dimensional parameters comprise air quality, wherein the route segments are scored based on air quality, and wherein an autonomous driving system and/or an automated smart infrastructure system applies the traffic model to enhance air quality.

In an embodiment, the public transport data includes data taken by at least one sensor including a magnetic loop sensor or a traffic sensor.

In another embodiment, a traffic control system comprises one or more processors which, alone or in combination, are configured to provide for execution of a method comprising: ingesting public transport data with one or more extract-transform-load procedures; reconstructing a route of a public transport vehicle based on the ingested public transport data; partitioning the reconstructed vehicle route into discrete route segments, each of the discrete route segments being defined by parameters spanning multiple dimensions; clustering the discrete route segments into multiple groups based on the respective multidimensional parameters of each of the discrete route segments; and scoring the route segments based on the clustering to create a traffic model, wherein the traffic model is useable to implement traffic control measures or to change mobility infrastructure.

Figure 3:
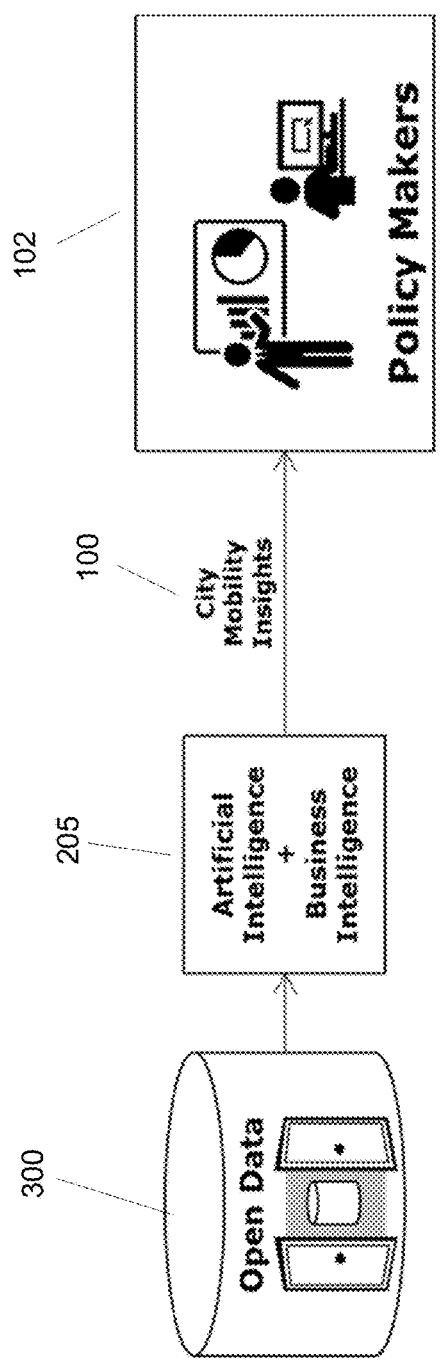
FIG. 3 illustrates mobility planning based on (e.g., based exclusively on) open and privacy-free (e.g., anonymized) data.

In a further embodiment, a tangible, non-transitory computer-readable medium is provided having instructions thereon which, upon being executed by one or more processors, cause the one or more processors, alone or in combination to provide for execution of a method comprising ingesting public transport data with one or more extract-transform-load procedures; reconstructing a route of a public transport vehicle based on the ingested public transport data; partitioning the reconstructed vehicle route into discrete route segments, each of the discrete route segments being defined by parameters spanning multiple dimensions; clustering the discrete route segments into multiple groups based on the respective multidimensional parameters of each of the discrete route segments; and scoring the route segments based on the clustering to create a traffic model, wherein the traffic model is useable to implement traffic control measures or to change mobility infrastructure The processing system can be configured to only rely on open data which does not contain individual data and has therefore no privacy implications (see FIG. 3). These embodiments can be configured to provide similar insights to city managers as those generated by the mentioned existing solutions, but these embodiments can be bootstrapped quickly for any city that operates a bus network (e.g., a network of one or more autonomous vehicles) and requires significantly less effort (e.g., processing resources including computational hardware, time, and energy) to operate. Further, the processing system can be configured to provide insights for cities that only provide static bus schedules.

The processing system can be configured to rely on artificial intelligence-supported (AI-supported) ETL procedures to (i) automate ingestion from semi-structured and structured data sources containing data related to public transport and/or (ii) for the integration of this data with a geographic information system (GIS).

Figure 4:
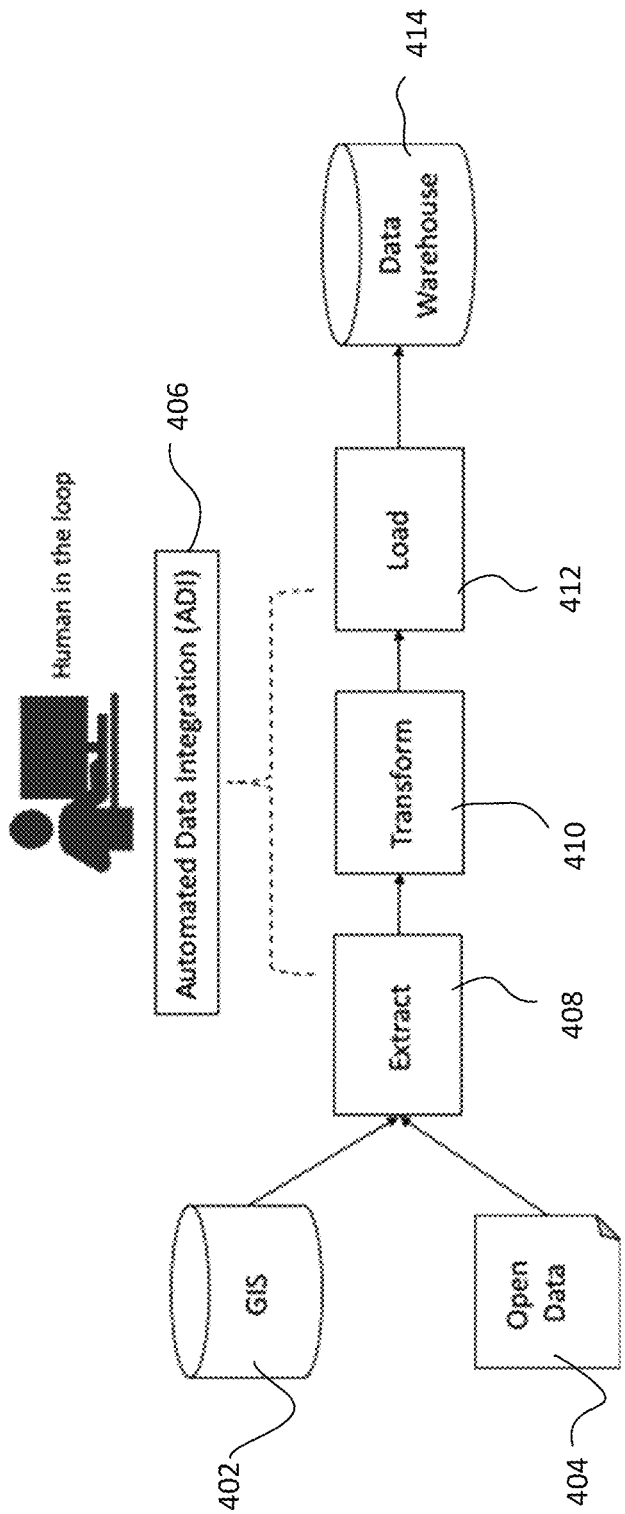
FIG. 4 illustrates automated data integration of GIS and (public transport) open data according to an embodiment.

Referring to FIG. 4, the processing system can receive GIS data 402 (e.g., a street-level map of a city) and open data 404. At block 406, the processing system (illustrated as a data warehouse 414) homogenize the data through automated data integration (ADI). ADI can include can perform an ETL procedure (blocks 408, 410, and 412). The depicted "human in the loop" can be absent. The processing system can be configured to perform each operation of FIG. 4 automatically.

Figure 5:
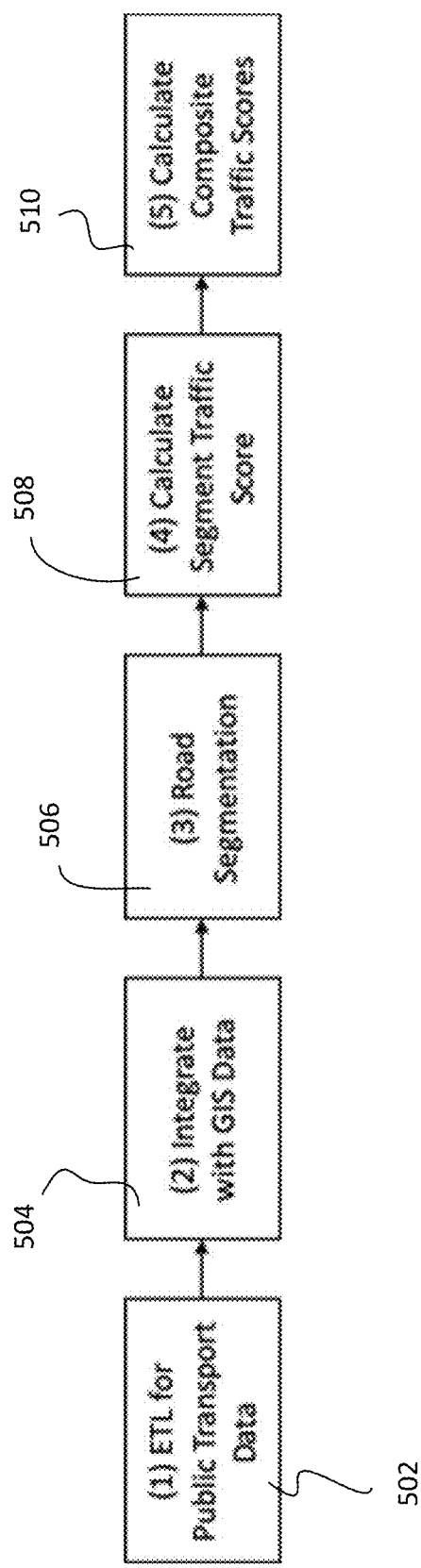
FIG. 5 illustrates a method of calculation of traffic scores based on multiple abstraction levels (e.g., road segments, bus routes, neighborhoods, and/or cities) according to an embodiment.

FIG. 5 depicts an embodiment (e.g., a configuration of the processing system) that enables the calculation of traffic scores on multiple abstraction levels (road segments, bus routes, neighborhoods, cities). The blocks (e.g., steps) of FIG. 5 are discussed below in further detail.

Block 502 includes ingesting public transport (e.g., bus) stops, lines, and schedules from public transport data. Through block 502, the processing system can ingest public transport data and integrate it into predefined internal data structures. In an embodiment, the public transport data is provided in one or more of the following formats: XML/JSON/txt. During block 502, the processing system can ingest semi-structured and structured data formats in order to extract the bus schedules. For example, the processing system can ingest data from widely available general transit feed specification (GTFS) data feeds.

In an embodiment, the processing system can be configured to integrate exact bus position historical data. Some public transportation companies offer real-time information of the exact bus position (based on GPS sensors mounted to each bus). Comparing these positions with the expected one can be used by the processing system as an index of traffic congestion and can be used for inferring the path a bus takes more accurately (see block 506). Therefore, embodiments of the present invention can be configured to integrate such information as well, if available.

Through block 502, the processing system can produce one or more (e.g., all of) the following outputs. As stated above, any instance of a specific vehicle (e.g., a "bus") can be replaced with the term "vehicle", "autonomous vehicle", or "public transportation".

<bus_stop>=(<stop_id>, <longitude>, <latitude>, <lines>), where: <stop_id> is a unique identifier for each bus stop; <longitude>, <latitude> are the GPS coordinates of the bus stop; and <lines> is an array of <line_id>, which point to (identify) the bus lines that are served by this bus stop.

<line>=(<line_id>, <bus_stops>, <trips>), where: <line_id> is a unique identifier for the bus line; <bus_stops> is an array of <stop_id>, which point to (identify) the stops served by this line; and <trips> is an array of <trip_id>, which point to (identify) the trips (e.g., daily instances) which this line has.

<trip>=(<trip_id>, <line_id>, <planned_times>, <actual_times> <estimated_times>)), where: <trip_id> is a unique identifier for the trip; <planned_times> is an array with schedules/planned arrival times of the line; <actual_times> is an attribute containing actual arrival times (e.g., provided through a GTFS real-time feed fed from GPS sensors deployed in the buses); and <estimated_times> is an attribute containing estimated times of arrival (ETA).

Many public transportation companies offer real-time information estimated time of arrival (ETA) of a bus for every bus stop based on a GPS sensor in the bus. ETA is a good indicator of traffic situation (e.g., ETA can index traffic congestion). During busy hours buses might experience the same traffic problems as cars. ETA usually is calculated based on the actual location of buses and calculated based on a traffic model of the transport company that estimates arrival time. Often ETA is public information, but actual live bus-locations are not made publicly available.

At block 504, the processing system can integrate ingested public transport data along with geographic information system (GIS). The result of this block (e.g., step) is to integrate the public transport data with an existing geographic information system. The input to block 504 can be the ingested public transport data (e.g., the data output by block 502) and GIS data (e.g., from systems such as OpenStreetMap, Google Maps, Bing Maps, etc.). GIS data can include a street-level map.

In an embodiment, the output of block 504 integrates and links the ingested public transport data to the GIS data using the global positioning system (GPS) coordinates of the available bus stops. Due to inaccurate GPS data, it can be challenging to determine the street side of a bus stop. The processing system can be configured to employ (1) the temporal dimension of the bus stops extracted from the GTFS data (e.g., recognizing that line1 first serves stopA and then stopB) and/or (2) the fact that bus operators aim to optimize the trip between stopA and stopB, avoiding U-turns, to serve a bus stop on the "wrong" side of the street. The GIS information also offers insight on the busiest areas at different time of the day, such as the morning (e.g. offices, schools), evening (e.g. bars, pubs) through associated metadata (e.g., opening hours, type of place).

At block 506, the processing system can be configured to segment (e.g., divide) road network into segments based on sequential bus stop location and/or road network structure. For example, a segment can be formed by taking two sequential bus stops and computing the most likely path between them. This path is often not obvious (e.g., there might be more than one likely route between stops). To find a best solution according to an embodiment, a machine learning model is trained based on cities where exact information about the bus routes exists. In other words, the information from these cities is used as training data. At block 506, the processing system can accept, as an input, the integrated public transport data and GIS data. Through block 506, the processing system can generate an output by segmenting the road network based on one or more of: the location of sequential bus stops and the road network characteristics such as number of lanes, distances, number of traffic stops.

In case the exact bus path (e.g., public transit path) is not available, the processing system can be configured to determinate the most likely path that connects two bus stops without actual bus location data between the stops. Because bus stops are sparse (e.g., in the US they are often around 0.25 miles, roughly 400 meters apart), multiple possible paths might exist between two sequential stops. To solve this problem, the processing system can be configured to learn from public transport systems where exact bus routes are defined and available and infer the routes for public transport systems where such information is not available. For example, the processing system can learn from existing bus routes what type of roads are preferred (characterizing them with different features such as number of lanes, speed limit, pedestrian crossings, close by office buildings, etc.) and calculate different routes from one bus stop to the next one, then choose the most likely route according to the characteristics of roads involved in each of them.

At block 508, the processing system can be configured to calculate a traffic score per segment. By performing block 508, embodiments of the processing system calculate a traffic score per segment based on actual data, calculate an adequate baseline, and compare the actual data with the adequate baseline. Block 508 can accept, as an input, road segments, e.g., the path between two sequential bus stops and associated GIS data and bus schedule data. Block 508 can produce as an output, a traffic score per road segment. This score can be calculated in many different ways. Examples include one or more of (e.g., all of):

a. The processing system calculates the traffic speed from the bus schedule data for each road segment. Then a comparative score is calculated based on a traffic path model considering the road network and the available GIS metadata such as, but not limited to speed limit, number of lanes, number of turns, traffic lights, time of day.

b. The processing system calculates the traffic speed from the bus schedule data for each road segment. Then a comparative score is calculated based on the minimal observed time for such road segment (e.g., during the night).

c. The processing system clusters road segments into clusters of similar road segments according to multiple dimensions. Road segments are similar according to their associated GIS data and characteristics (e.g., but not limited to the number of lanes, traffic lanes, speed limit, turns, number of businesses). Such clustering can be performed for a single city, but more importantly across different cities. The processing system can then calculate the traffic score by comparing the traffic speed observed for each segment in relation to all observed speeds. The processing system can, for example, categorize the observed traffic situation by assigning traffic scores to different quantiles of the data distribution.

At block 510, the processing system can calculate composite traffic scores/city mobility benchmark model. Block 510 can accept, as an input, the road segments with associated traffic scores and GIS city metadata. Block 510 can produce, as an output, aggregated road segment traffic scores on different granularities (e.g., resolutions). Examples include:

a. Composite score for bus route. This score is useful for the processing system to optimize public transport routes. Traffic operators (e.g., traffic operation software automatically performed by the processing system) can attempt different routes and choose the one with the lowest traffic score, thus optimizing the transport route and achieving faster trips. The composite traffic scores can be used as an input or feature of a traffic routing algorithm. For example, it could be possible to avoid streets for which a high traffic density at a specific time is predicted by the system. Also, similar routes A and B can be determined and compared in order to optimize their planning and infrastructure. If route B shows a much higher composite score than route A, this information can be used to optimize traffic light scheduling for route B, with the goal of showing similar patterns to route A.

b. Composite score/model for city (based on all segments). For this score, the processing system can aggregate the single traffic scores of segments in order to calculate a composite traffic score of the city by dividing the sum of the segment score by the number of segments.

The processing system can calibrate based on magnetic loop road sensors to determine (e.g., estimate) the number of cars solely from bus schedules. The processing system can use existing (sparse) magnetic loop sensors as calibration variable in order to give an estimation of the number of cars on a specific road segment. For example, if Road Segment A has a magnetic loop sensor and a bus line, and Road Segment B has none such sensor, but Road Segment B shows similar features compared to Road Segment A, we can estimate the number of cars in Road Segment B solely based on the bus schedule.

The processing system can include other IoT data sources. The processing system can rely on (e.g., consult) existing IoT data sources for further improvement of the resulting accuracy. Examples of such sources are traffic light sensors and schedules, WiFi infrastructure that might be used to estimate traffic density or traffic cameras. Other sources can be used.

The processing system can include data from enterprise resource planning (ERP) systems of a city and/or a public transport company. The processing system can connect to (or include) an ERP system run by the city and/or the public transport company. Such system can provide direct and more accurate (real-time) data on current bus ETAs and live locations, but more importantly gives the processing system access to additional data that helps to improve its accuracy. This data might be in the form of ticket sales for different bus lines that can be used to calibrate the calculated traffic scores (the reason is that buses carrying more passengers are slower than buses carrying only few passengers).

The processing system can extend the approach to other environmental sensing modalities. Put differently, the processing system can be configured to extend the approach to different modalities besides mobility. An example for such modality is air quality. An extension to (e.g., additional software loaded on) the processing system can compute relative scores for air quality based on integrated GIS data, air quality sensing data and (from bus schedules derived) mobility data. In an embodiment, the processing system clusters segments of a route based on sensed air quality data and/or assigns an air quality score to each of the segments of the route. The processing system can apply the benchmark model to enhance air quality by causing an autonomous driving system and/or a smart infrastructure system to re-route a vehicle and/or adjust traffic light timings based on air quality.

The processing system can apply city mobility benchmark model to transfer learning. The model generated by the processing system can be used in transfer learning applications. For example, by discovering similar road segments inside a single city and across cities, trained models on one road segment do not need to be re-trained for a similar road segments and can be re-used. For example, a trained model that uses wireless signals to count people in one road segments can be re-used in a similar road segment without re-training effort.

Figure 6:
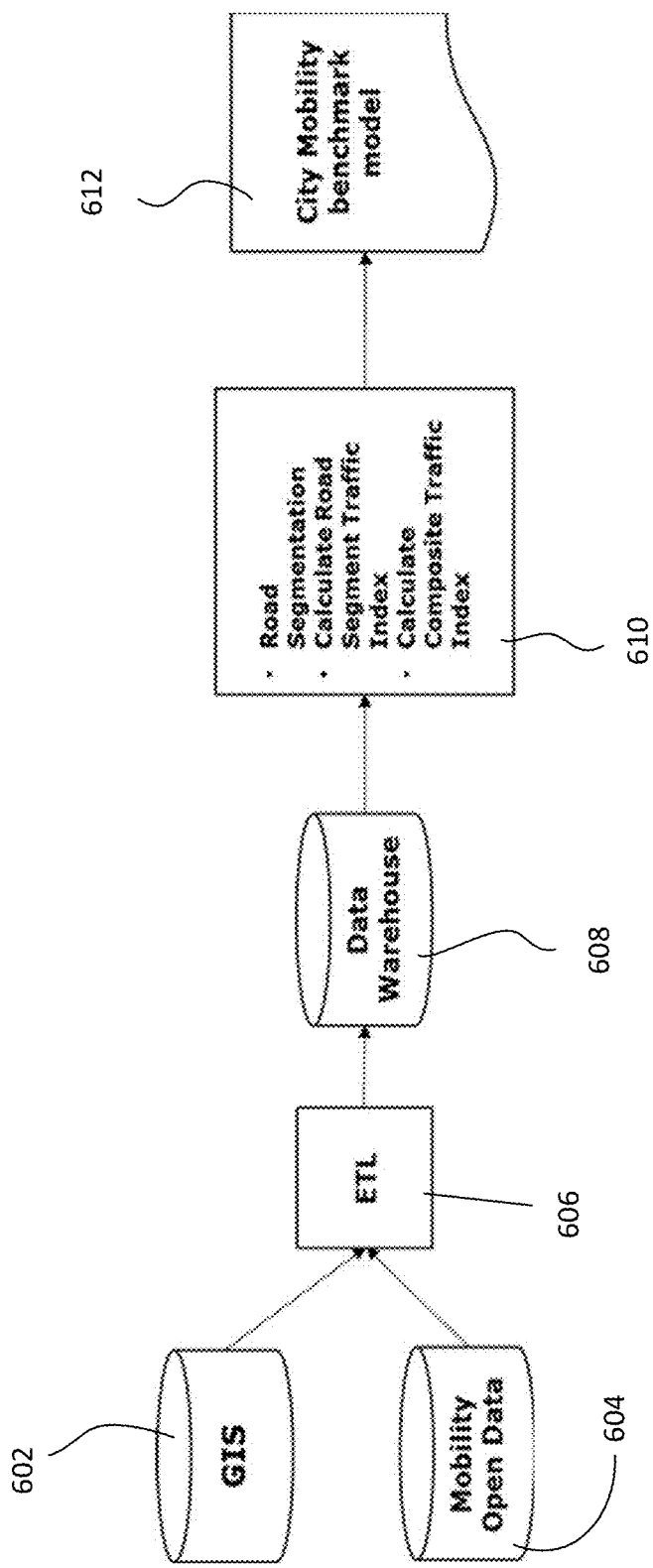
FIG. 6 illustrates generation of a static mobility benchmark model for a city according to an embodiment. The model can be generated based on (e.g., exclusively based on) open and privacy-free data.

FIG. 6 shows generation of a static mobility benchmark model for a city using, for example, only open and privacy-free data. Referring to FIG. 6, The first step for a city to become smart city is to publish data of public interested as open data. In addition, in many countries, regulations oblige governance to spend effort to publish such data. Therefore, open data regarding mobility is available for a very large number of cities. The processing system can start from the mobility open dataset and the GIS available data (such as OpenStreetMap) and with means of extract-transform-load (ETL). On this input the fusion analytics part (e.g., the fusion analytics component of the processing system operations) can take place for calculating the city mobility insights as a City Mobility Benchmarking model.

Figure 7:
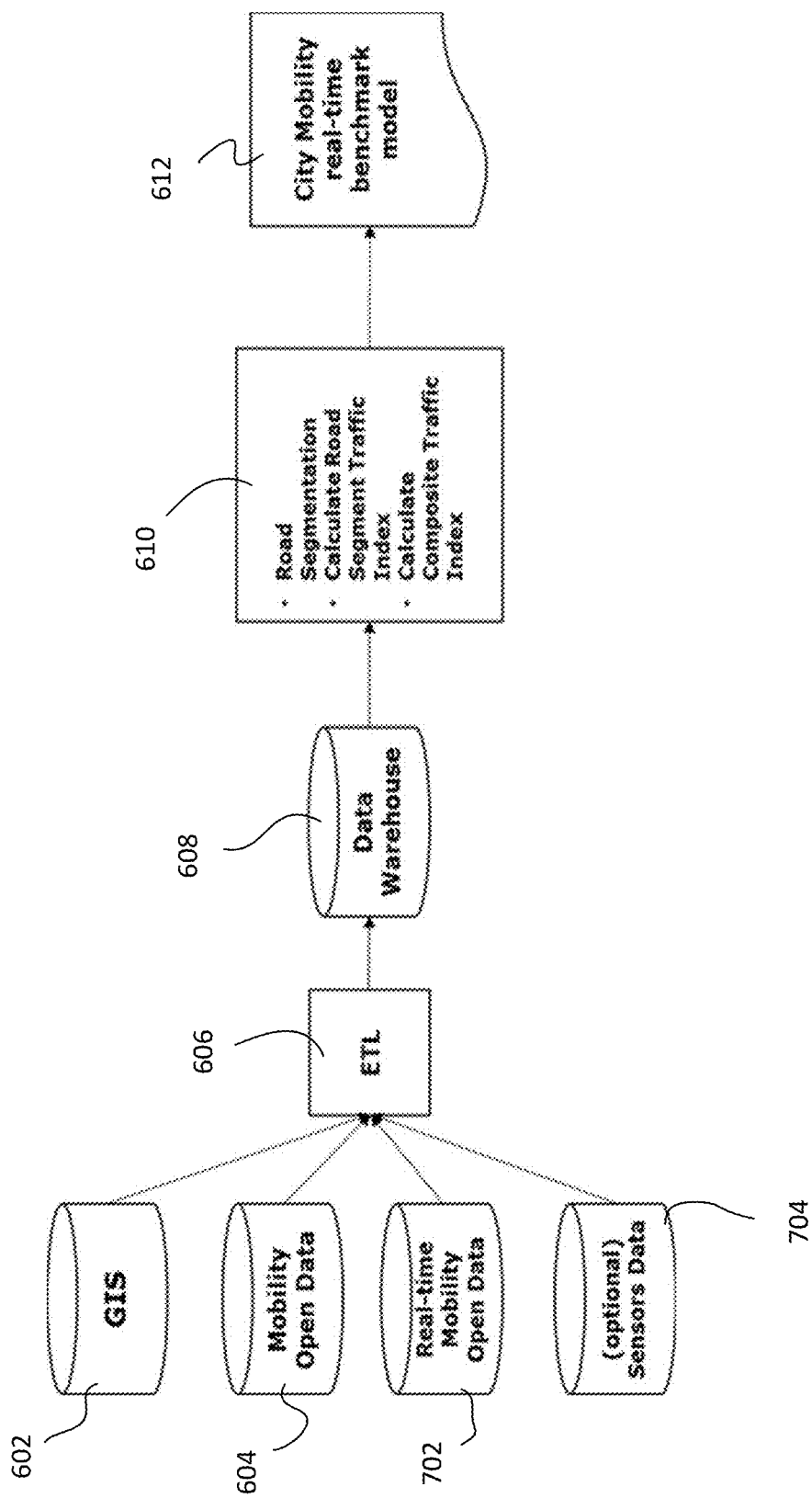
FIG. 7 illustrates generation of a real-time mobility benchmark model for a city using both static and real-time open and privacy-free data, according to an embodiment.

Referring to FIGS. 6 and 7, the processing system can receive GIS data 602 (e.g., a street-level map of a city) and mobility open data 604. At block 606, the processing system (illustrated as a data warehouse 608) can perform an ETL procedure to homogenize the data. At block 610, the processing system can perform road segmentation. Based on the road segmentation, the processing system can calculate road segment traffic indexes (e.g., an index for each road segment). In some embodiments, route segmentation occurs instead of, or in addition to, road segmentation. The processing system can calculate a composite traffic index based on the individual road segment (or route segment) traffic indexes. At block 612, the processing system can generate a city mobility benchmark model based on the composite traffic index.

FIG. 7 shows generation of a real-time mobility benchmark model for a city using both static and real-time open and privacy-free data. Referring to FIG. 7, the processing system can be configured to predict the situation (e.g., congestion) of a city with public transportation companies that provide real-time data regarding the status of their fleet (e.g., sensor data 702 such as GPS data). Optionally the city might have also additional real-time data 704 coming from its IoT infrastructure, such as traffic situation based on magnetic loops. From this available data, the processing system can be configured to apply ETL techniques to homogenize the data and afterwards the fusion analytics continuously compiles a real-time city mobility benchmark model. The latter is not only useful for city planners and policy makers, but can also directly be used as input for online decisions, e.g. smart mobility apps.

Figure 8:
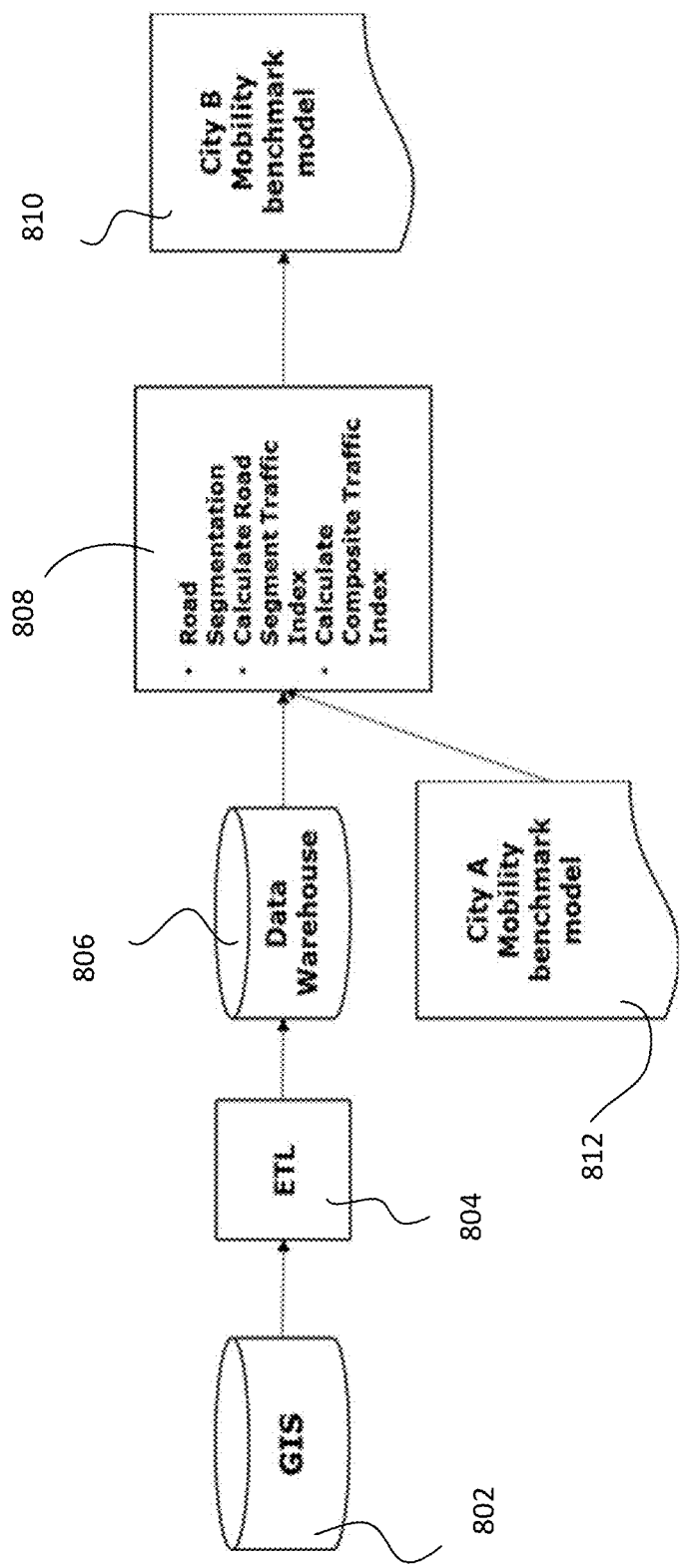
FIG. 8 illustrates generation of a static benchmark model for a city lacking open data, according to an embodiment.

FIG. 8 shows generation of a static benchmark model for a city lacking open data, making leverage of another city benchmark model. Referring to FIG. 8, in some cases, cities completely lack open data. In this case, the processing system can be configured to calculate the city benchmark making leverage of mobility benchmark models from other cities by comparing road segments and road clustering and GIS information. First the GIS data of CityB is ingested (blocks 802 and 804) in the data warehouse 806 (e.g., by the processing system). Then, the data fusion analytics is applied at block 808 based on the ingested data and a previously prepared mobility benchmark model of CityA 812. Road segments of CityB are compared with road segments of the mobility benchmark model of CityA. If a road segment of CityB, namely roadSegmentCityB-x, has very similar characteristics of a road segment CityA, namely roadSegmentCityA-y, e.g. similar concentration of buildings of a particular destination of business such as schools or office, similar road width or similar concentration of buildings, then the score roadSegmentCityA-y is given to roadSegmentCityB-x. Similarity can be determined based on a number of features such as the number of lanes, speed limit, pedestrian crossings, proximity to office buildings, etc. At the end of this process, a mobility benchmarking model 810 for City B is generated.

Figure 9:
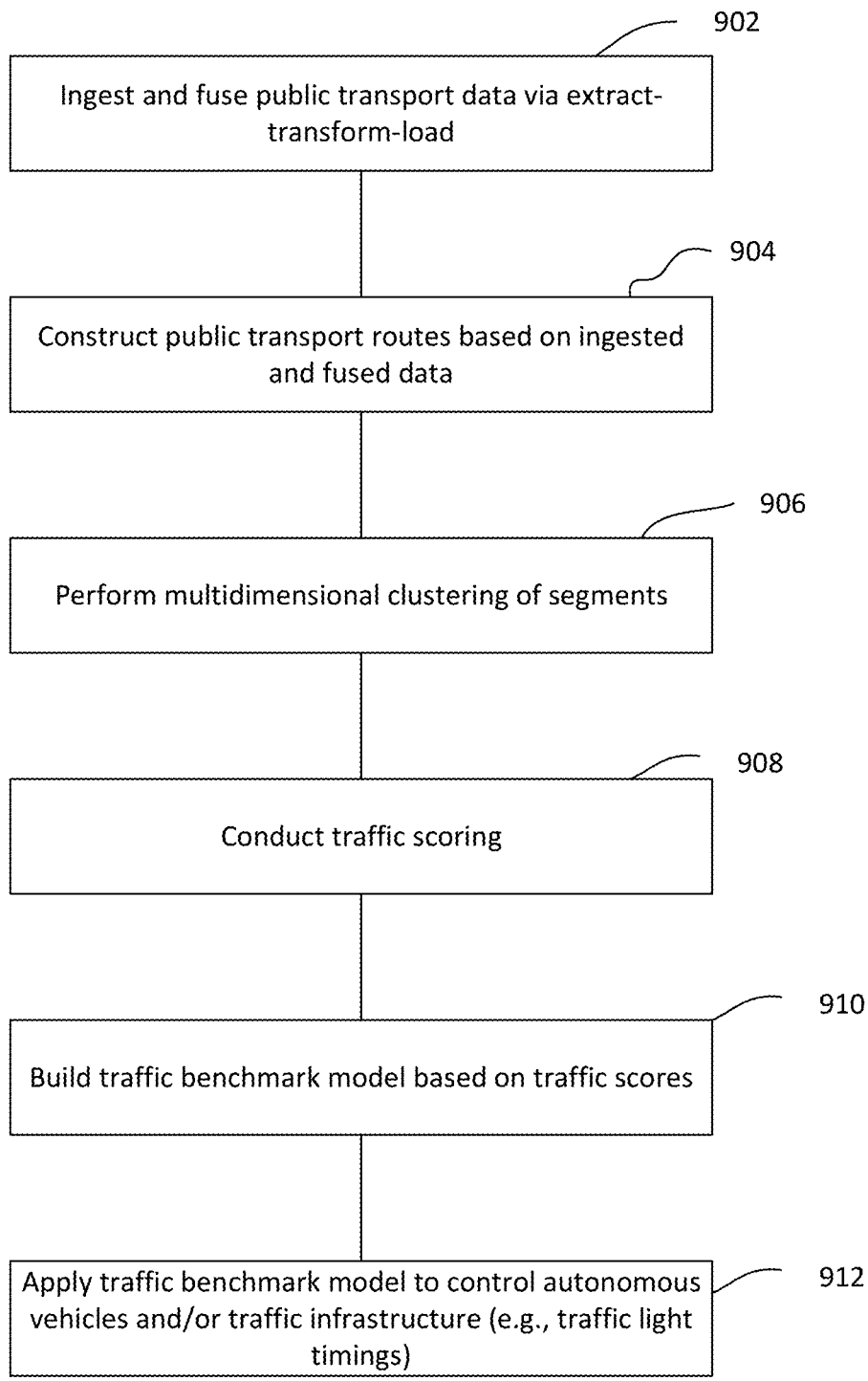
FIG. 9 illustrates a method, according to an embodiment, of: (i) benchmarking city traffic situation by the fusion of publicly available transport open data in form of bus data with GIS data (e.g., GIS data combined with real-time GPS location data); and/or (ii) applying city traffic benchmark model to another city, resulting in finding similarities in road segments and roads through clustering.

The method of FIG. 9 can be for one or more of (i) benchmarking city traffic situation by the fusion of publicly available transport open data in form of bus data with GIS data (e.g., GIS data combined with real-time GPS location data); (ii) applying city traffic benchmark model to another city, resulting in finding similarities in road segments and roads through clustering. As with all operations disclosed herein, the processing system can be configured to automatically perform the method of FIG. 9.

At block 902, the processing system can perform ingestion and fusion of public transport data by means of extract-transform-load procedures. The public transport data can include one or more of (e.g., all of): open data regarding mobility such as bus routes, bus lines, GIS data, real-time mobility open data, and/or sensors data available as structured or semi-structured data.

At block 904, the processing system can perform construction of bus routes or, in other words, estimate the paths of existing bus routes (e.g., how sequential bus stops are connected through a bus line, which streets are used) solely from bus stop locations, bus lines and bus schedules and existing historical bus locations for similar segments from the same and optionally other cities. The bus routes are typically not available, but the bus stop locations and their sequential order is typically available. The processing system can construct the bus routes based on the ingested and fused public transport data of block 902. For example, the GIS data can include a street-level map. At block 904, the processing system can be configured to (i) place each stop on the street-level map, then (ii) connect the stops in a manner consistent with the street-level map to determine an estimated bus route. As a result, the processing system can be configured to reconstruct a complete bus route from data listing the time and location of bus stops, but lacking the route traversed between sequential stops.

At block 906, the processing system can perform multi-dimensional clustering of segments (e.g., the reconstructed bus routes of block 904) for a single city and optionally, across multiple cities, based on the segments' characteristics (e.g., one or more of a number of traffic lights, turns, lanes, speed limits). The clustering is performed to find similar segments in order to calculate comparable traffic scores. For example, it could be provided in an embodiment to assign a score from 1-10 for a segment. Thresholds could also be used and scores could be assigned based on these thresholds (e.g., these thresholds could be defined by the government, historical data, best practices or even initially arbitrarily). Similar segments are found based on the clustering. Then, the scores can be simply ordered in each cluster and scores can be assigned to different quantiles (e.g., the worst 10%, the best 10%). At block 908, the processing system can perform a traffic scoring method for road segments, road routes and the overall city in order to create a city traffic benchmark model at block 910. Specifically, the clustering results in adequate scores being calculated per segment. These segment scores can then be used to calculate scores for segments of a bus route or for the overall city. For example, a method according to an embodiment is used for finding bus routes. Each bus route contains a number of segments. An overall score can be calculated for a route according to an embodiment by summing up the segment scores. The model then provides a traffic score for this route at different times. This process can be repeated for the overall city.

At block 912, the processing system can apply the benchmark model as an input for various applications. The applications can be software performed by the processing system. For example, the benchmark model can be used as input for autonomous driving systems (e.g., autonomous driving software running on the processing system, which can include processing hardware mounted to individual vehicles each including a motor and wheels) to enable better path planning and decision making and as input for actuation decisions on top of connected smart city infrastructure. In an embodiment, the processing system can apply the model as an input to a smart infrastructure system. The smart-infrastructure system can be software running on the processing system configured to operate connected traffic lights more efficiently by, for example, actuating the traffic lights so they support the flow of traffic and avoid bottlenecks discovered through the model. For example, the model could indicate that there is not a lot of traffic on a route during the night. This information can then be used to schedule traffic lights in the night to reduce the green phase on that route. On the other hand, the model could show that there is dense traffic on one route, and this information could be used to increase the period of green phase to increase traffic flow. For autonomous vehicles, the model could be used to improve navigation (e.g., avoiding routes with dense traffic). According to another embodiment, a system could use the model to try to more evenly distribute traffic. Preferably, autonomous vehicles would not perform decisions individually, but jointly, so that the overall reward becomes highest.

Figure 10:
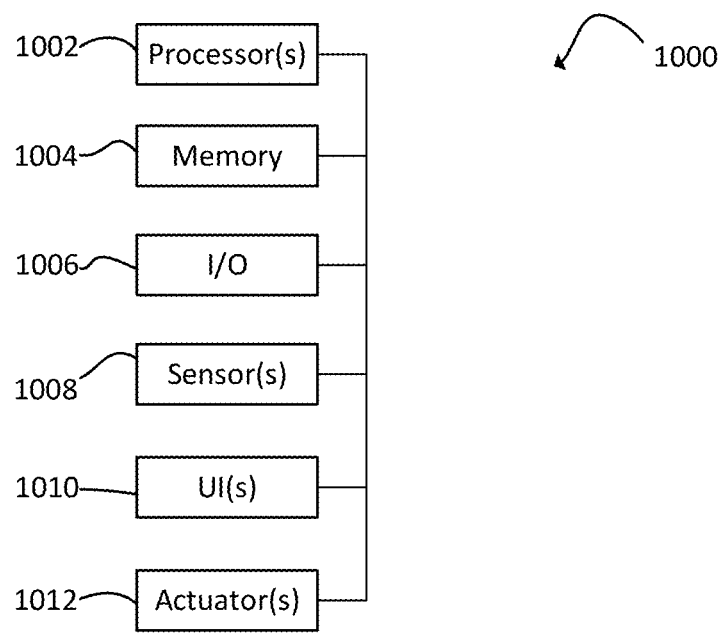
FIG. 10 illustrates a block diagram of a processing system, according to an embodiment.

Referring to FIG. 10, a processing system 1000 can include one or more processors 1002, memory 1004, one or more input/output devices 1006, one or more sensors 1008, one or more user interfaces 1010, and one or more actuators 1012. Processing system 1000 can be representative of each computing system disclosed herein. Processing system 1000 can include hardware mounted in one or more autonomous vehicles. Alternatively, or in addition, processing system 1000 can be configured to issue commands (e.g., route updates) to processing systems disposed in one or more autonomous vehicles. Therefore, processing system 1000 can control the motor and steering system of each of one or more autonomous vehicles.

Processors 1002 can include one or more distinct processors, each having one or more cores. Each of the distinct processors can have the same or different structure. Processors 1002 can include one or more central processing units (CPUs), one or more graphics processing units (GPUs), circuitry (e.g., application specific integrated circuits (ASICs)), digital signal processors (DSPs), and the like. Processors 1002 can be mounted on a common substrate or to different substrates.

Processors 1002 are configured to perform a certain function, method, or operation (e.g., are configured to provide for performance of a function, method, or operation) at least when one of the one or more of the distinct processors is capable of performing operations embodying the function, method, or operation. Processors 1002 can perform operations embodying the function, method, or operation by, for example, executing code (e.g., interpreting scripts) stored on memory 1004 and/or trafficking data through one or more ASICs. Processors 1002, and thus processing system 1000, can be configured to perform, automatically, any and all functions, methods, and operations disclosed herein. Therefore, processing system 1000 can be configured to implement any of (e.g., all) the protocols, devices, mechanisms, systems, and methods described herein.

For example, when the present disclosure states that processing system 1000 performs/can perform task "X" (or that task "X" is performed), such a statement should be understood to disclose that processing system 1000 can be configured to perform task "X". Processing system 1000 is configured to perform a function, method, or operation at least when processors 1002 are configured to do the same.

Memory 1004 can include volatile memory, non-volatile memory, and any other medium capable of storing data. Each of the volatile memory, non-volatile memory, and any other type of memory can include multiple different memory devices, located at multiple distinct locations and each having a different structure. Memory 1004 can include cloud storage.

Examples of memory 1004 include a non-transitory computer-readable media such as RAM, ROM, flash memory, EEPROM, any kind of optical storage disk such as a DVD, a Blu-Ray® disc, magnetic storage, holographic storage, a HDD, a SSD, any medium that can be used to store program code in the form of instructions or data structures, and the like. Any and all of the methods, functions, and operations described herein can be fully embodied in the form of tangible and/or non-transitory machine-readable code (e.g., interpretable scripts) saved in memory 1004.

Input-output devices 1006 can include any component for trafficking data such as ports, antennas (i.e., transceivers), printed conductive paths, and the like. Input-output devices 1006 can enable wired communication via USB®, DisplayPort®, HDMI®, Ethernet, and the like. Input-output devices 1006 can enable electronic, optical, magnetic, and holographic, communication with suitable memory 1006. Input-output devices 1006 can enable wireless communication via WiFi®, Bluetooth®, cellular (e.g., LTE®, CDMA®, GSM®, WiMax®, NFC®), GPS, and the like. Input-output devices 1006 can include wired and/or wireless communication pathways.

Sensors 1008 can capture physical measurements of environment and report the same to processors 1002. User interface 1010 can include displays, physical buttons, speakers, microphones, keyboards, and the like. Actuators 1012 can enable processors 1002 to control mechanical forces. Examples of actuators 1012 include a motor configured to drive one or more wheels of an autonomous vehicle and a steering system configured to direct an autonomous vehicle.

Processing system 1000 can be distributed. For example, some components of processing system 1000 can reside in a cloud computing environment while other components of processing system 1000 can reside in a local computing system (e.g., within individual vehicles). Processing system 1000 can have a modular design where certain modules include a plurality of the features/functions shown in FIG. 10. For example, I/O modules can include volatile memory and one or more processors. As another example, individual processor modules can include read-only-memory and/or local caches.

Figure 11:
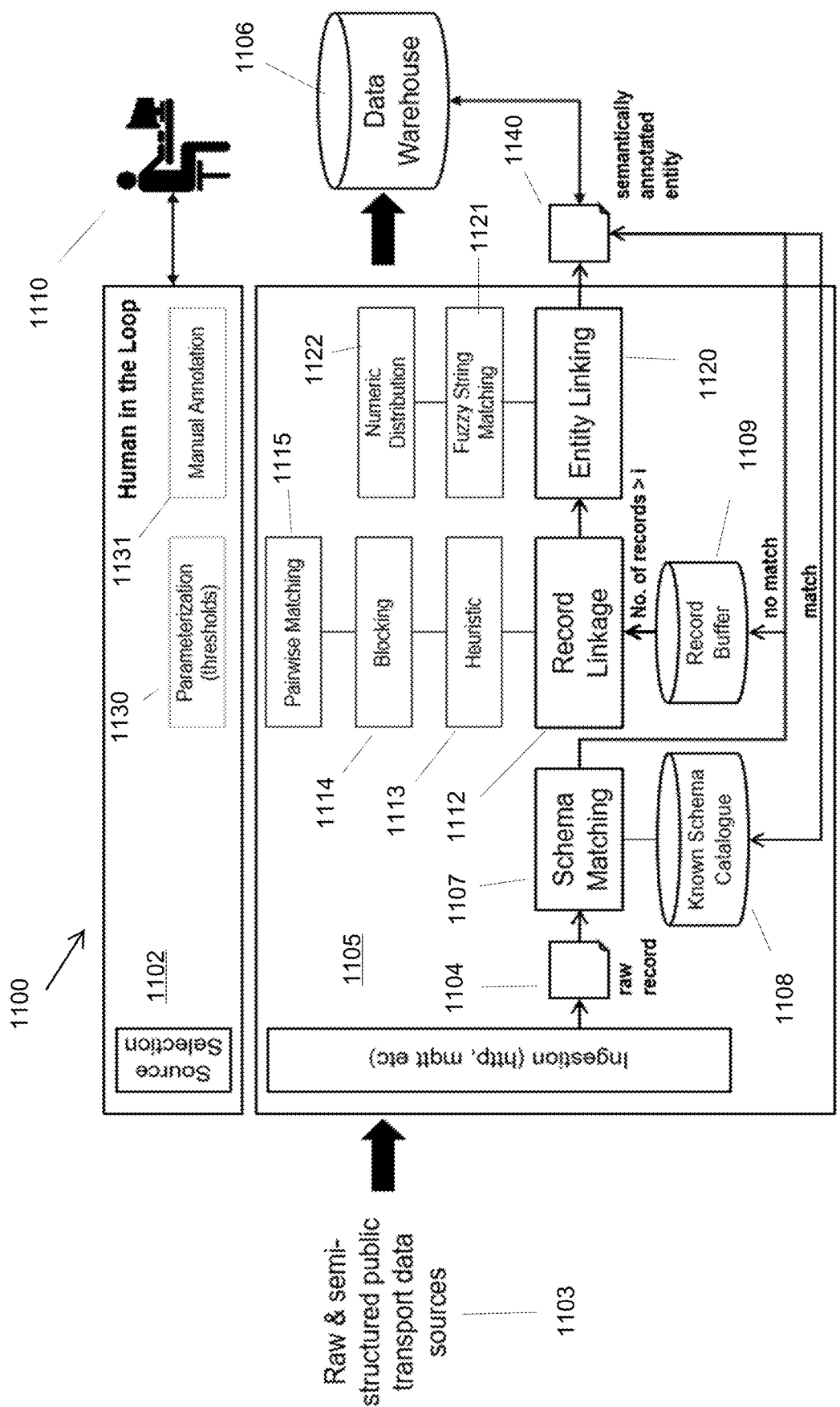
FIG. 11 schematically illustrates a method and system for performing extract-transform-load (ETL) procedures according to embodiments.

FIG. 11 schematically illustrates a method and system 1100 for performing ETL procedures according to embodiments, in particular depicting the overall working of an ETL pipeline according to an embodiment using raw and/or semi-structured data sources to ingest 103. Users 1110 can configure semi-structured data sources, which can then be ingested by an ingestion system 1105 using different interfaces such as representational state transfer hypertext protocol application programming interfaces (REST HTTP APIs). For example, a user 1110 can perform source selection 1102, including performing parametrization 1130 and annotation 1131 of data of different data sources. As a first step, it is checked whether the structure of the data sources to ingest 1103 has already been processed and is therefore present in a known schema catalog 1108 or is a raw record 1104. If a match is found in this schema matching step 1107, the new data is directly integrated, thereby saving computational effort and processing data streams more timely. If no match is found, the data is temporarily stored in a record buffer 1109, where it will be stored until a sufficient, configurable number of records has been retrieved in order to analyze record keys and values for record linkage. In a record linkage step 1112, different records of the same entity are linked using a data specific heuristic 1113, while applying traditional record linkage techniques of blocking 1114 and pairwise matching 1115 as fallback. Users 1110 are able to inspect results and configure parameters to improve linkage. Next, an automated entity linking step 1120 is performed by combining (1) string similarity metrics for keys and textual values (i.e., searching for a similar term in the existing data warehouse 1106), or fuzzy string matching with (2) the distribution of numerical values, or numeric distribution 1122. The distance between the observed distribution of numerical values and existing, semantically labeled distributions is computed. Lastly, the extracted semantically annotated entity 1140 can be integrated in the existing data warehouse 1106 and used in the steps to create a city benchmark model according to embodiments of the invention discussed herein.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for traffic control, the method comprising:
ingesting public transport data with one or more extract-transform-load procedures;
reconstructing a route of a public transport vehicle based on the ingested public transport data;
partitioning the reconstructed vehicle route into discrete route segments, each of the discrete route segments being defined by parameters spanning multiple dimensions;
clustering the discrete route segments into multiple groups based on the respective multidimensional parameters of each of the discrete route segments; and
scoring the route segments based on the clustering to create a traffic model;
wherein the traffic model is useable to implement traffic control measures or to change mobility infrastructure.

2. The method of claim 1, wherein the model is useable as an input to at least one of an autonomous driving system and an automated smart infrastructure system.

3. The method of claim 1, wherein the ingested public transport data comprises open transport data, geographical information system (GIS) data and global-positioning-system (GPS) data.

4. The method of claim 1, wherein the traffic model is a first traffic model and the method further comprises scoring the respective route segments by clustering the respective route segments with pre-scored route segments of a preexisting second traffic model.

5. The method of claim 4, wherein the second traffic model is from a different geographical location than the first traffic model, and wherein the clustering determines similarities among the respective route segments of the different geographical locations.

6. The method of claim 1, wherein ingesting the public transport data comprises structuring the public transport data into a sequence of stops.

7. The method of claim 6, wherein the route of the public transport vehicle is reconstructed by projecting a respective path of the public transport vehicle between multiple pairs of consecutive stops of the sequence of stops.

8. The method of claim 6, wherein the public transport data includes bus lines, bus stop locations, and bus schedules, wherein the route of the public transport vehicle is a bus route, and wherein the stops are bus stops.

9. The method of claim 1, wherein the traffic model serves as an input to an autonomous driving system such that the vehicle or another vehicle is autonomously routed based on the traffic model.

10. The method of claim 1, wherein the traffic model serves as an input to an automated smart infrastructure system such that the smart infrastructure system autonomously controls traffic light timings based on the traffic model.

11. The method of claim 1, wherein the multi-dimensional parameters comprise one or more of a number of traffic lights, a number of turns, a number of lanes, and a speed limit.

12. The method of claim 1, wherein the multi-dimensional parameters comprise air quality, wherein the route segments are scored based on air quality, and wherein an autonomous driving system and/or an automated smart infrastructure system applies the traffic model to enhance air quality.

13. The method of claim 1, wherein the public transport data includes data taken by at least one sensor including a magnetic loop sensor or a traffic sensor.

14. The method according to claim 1, further comprising implementing the traffic control measures of changing the mobility infrastructure based on a prediction of the traffic model.

15. A traffic control system comprising memory and one or more processors which, alone or in combination, are configured to provide for execution of a method comprising:
ingesting public transport data with one or more extract-transform-load procedures;
reconstructing a route of a public transport vehicle based on the ingested public transport data;
partitioning the reconstructed vehicle route into discrete route segments, each of the discrete route segments being defined by parameters spanning multiple dimensions;
clustering the discrete route segments into multiple groups based on the respective multidimensional parameters of each of the discrete route segments; and
scoring the route segments based on the clustering to create a traffic model;
wherein the traffic model is useable to implement traffic control measures or to change mobility infrastructure.

16. A tangible, non-transitory computer-readable medium having instructions thereon which, upon being executed by one or more processors having access to memory, cause the one or more processors, alone or in combination, to provide for execution of a method comprising:
ingesting public transport data with one or more extract-transform-load procedures;
reconstructing a route of a public transport vehicle based on the ingested public transport data;
partitioning the reconstructed vehicle route into discrete route segments, each of the discrete route segments being defined by parameters spanning multiple dimensions;
clustering the discrete route segments into multiple groups based on the respective multidimensional parameters of each of the discrete route segments; and
scoring the route segments based on the clustering to create a traffic model;
wherein the traffic model is useable to implement traffic control measures or to change mobility infrastructure.

* * * * *